(12) United States Patent
Wu et al.

(10) Patent No.: US 10,522,490 B2
(45) Date of Patent: Dec. 31, 2019

(54) SEMICONDUCTOR PACKAGE AND METHOD OF FORMING THE SAME

(71) Applicant: Taiwan Semiconductor Manufacturing Company, Ltd., Hsinchu (TW)

(72) Inventors: Chi-Hsi Wu, Hsinchu (TW); Der-Chyang Yeh, Hsinchu (TW); Hsien-Wei Chen, Hsinchu (TW); Jie Chen, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/036,664

(22) Filed: Jul. 16, 2018

(65) Prior Publication Data

US 2018/0342474 A1     Nov. 29, 2018

Related U.S. Application Data

(63) Continuation of application No. 15/707,700, filed on Sep. 18, 2017, now Pat. No. 10,026,704, which is a
(Continued)

(51) Int. Cl.
*H01L 23/24*      (2006.01)
*H01L 21/00*      (2006.01)
(Continued)

(52) U.S. Cl.
CPC .......... *H01L 24/08* (2013.01); *H01L 21/486* (2013.01); *H01L 21/4853* (2013.01); *H01L 21/4857* (2013.01); *H01L 21/565* (2013.01); *H01L 23/481* (2013.01); *H01L 23/49811* (2013.01); *H01L 23/5383* (2013.01); *H01L 23/5384* (2013.01); *H01L 23/5386* (2013.01); *H01L 23/5389* (2013.01); *H01L 24/80* (2013.01); *H01L 24/94* (2013.01); *H01L 24/97* (2013.01); *H01L 25/0652* (2013.01);
(Continued)

(58) Field of Classification Search
CPC ............... H01L 21/4853; H01L 21/486; H01L 23/5384; H01L 23/5386; H01L 24/04; H01L 24/08
USPC ............................ 257/723, 724, 621; 438/46
See application file for complete search history.

(56) References Cited

U.S. PATENT DOCUMENTS 8,822,268 B1     9/2014   Magnus
2005/0253241 A1  11/2005  Hall
(Continued)

FOREIGN PATENT DOCUMENTS

CN     104009014 A     8/2014
CN     104067383 A     9/2014
(Continued)

*Primary Examiner* — David S Blum
(74) *Attorney, Agent, or Firm* — Slater Matsil, LLP

(57) ABSTRACT

An embodiment is a method including forming a first passive device in a first wafer, forming a first dielectric layer over a first side of the first wafer, forming a first plurality of bond pads in the first dielectric layer, planarizing the first dielectric layer and the first plurality of bond pads to level top surfaces of the first dielectric layer and the first plurality of bond pads with each other, hybrid bonding a first device die to the first dielectric layer and at least some of the first plurality of bond pads, and encapsulating the first device die in a first encapsulant.

20 Claims, 23 Drawing Sheets

Related U.S. Application Data continuation of application No. 15/272,491, filed on Sep. 22, 2016, now Pat. No. 9,768,133.

(51) Int. Cl.

| | | |
|---|---|---|
| *H01L 23/00* | (2006.01) | |
| *H01L 23/498* | (2006.01) | |
| *H01L 21/48* | (2006.01) | |
| *H01L 23/538* | (2006.01) | |
| *H01L 21/56* | (2006.01) | |
| *H01L 23/48* | (2006.01) | |
| *H01L 25/065* | (2006.01) | |
| *H01L 25/00* | (2006.01) | |
| *H01L 23/31* | (2006.01) | |
| *H01L 23/532* | (2006.01) | |
| *H01L 29/06* | (2006.01) | |

(52) U.S. Cl.
CPC ............ *H01L 25/50* (2013.01); *H01L 21/561* (2013.01); *H01L 23/3128* (2013.01); *H01L 23/5329* (2013.01); *H01L 23/53223* (2013.01); *H01L 23/53238* (2013.01); *H01L 23/53266* (2013.01); *H01L 24/05* (2013.01); *H01L 29/0657* (2013.01); *H01L 2224/05571* (2013.01); *H01L 2224/05647* (2013.01); *H01L 2224/08147* (2013.01); *H01L 2224/08265* (2013.01); *H01L 2224/08267* (2013.01); *H01L 2224/80895* (2013.01); *H01L 2224/80896* (2013.01); *H01L 2225/06548* (2013.01); *H01L 2225/06558* (2013.01); *H01L 2225/06582* (2013.01); *H01L 2924/1205* (2013.01); *H01L 2924/1206* (2013.01); *H01L 2924/1207* (2013.01)

(56) References Cited

U.S. PATENT DOCUMENTS

| | | |
|---|---|---|
| 2007/0001278 A1 | 1/2007 | Jeon et al. |
| 2007/0045796 A1 | 3/2007 | Ye et al. |
| 2013/0181330 A1 | 7/2013 | Ramachandran et al. |
| 2014/0210107 A1 | 7/2014 | Zhai |
| 2015/0041987 A1 | 2/2015 | Yew et al. |
| 2016/0056057 A1 | 2/2016 | Yu et al. |

FOREIGN PATENT DOCUMENTS

| | | |
|---|---|---|
| CN | 104576417 A | 4/2015 |
| KR | 20150017681 A | 2/2015 |
| KR | 20160023529 A | 3/2016 |
| TW | 200709360 A | 3/2007 |
| TW | 1333267 B | 11/2010 |
| TW | 201440186 A | 10/2014 | ns
SEMICONDUCTOR PACKAGE AND METHOD OF FORMING THE SAME

PRIORITY CLAIM AND CROSS-REFERENCE

This application is a continuation of U.S. patent application Ser. No. 15/707,700, filed Sep. 18, 2017, now U.S. Pat. No. 10,026,704, which is a continuation of U.S. patent application Ser. No. 15/272,491, filed Sep. 22, 2016, now U.S. Pat. No. 9,768,133, issued on Sep. 19, 2017, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
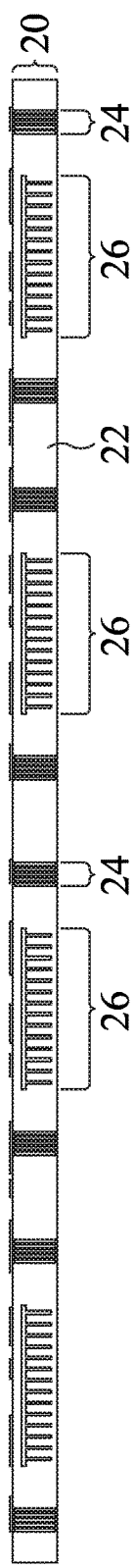
FIGS. 1 through 13 illustrate cross-sectional views of intermediate steps during a process for forming a package structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure and methods of forming the package structure including an integrated fan-out design that enables more functionality and reliability. The package structures may include a chip/die that is hybrid bonded to a wafer structure with the wafer structure including one or more integrated passive devices (IPDs). Some of disclosed methods of forming the package structure include optimization of the method that does not require as many carrier substrates as other methods. Further, the hybrid bonding process allows for the bond between the chip/die and the wafer to not include a solder material, and thus, may increase the reliability and yield of package structures.

Further, the teachings of this disclosure are applicable to any package structure including an integrated chip/die and/or integrated passive devices. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIGS. 1 through 13 illustrate cross-sectional views of intermediate steps during a process for forming a package structure in accordance with some embodiments. In FIG. 1, a wafer 20 is illustrated including a substrate 22, through vias 24, and passive devices 26. The substrate 22 may be a semiconductor substrate, such as a bulk semiconductor, a semiconductor-on-insulator (SOI) substrate, or the like, which may be doped (e.g., with a p-type or an n-type dopant) or undoped. The substrate 22 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 22 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the substrate 22 may include active devices (not shown) in addition to the passive devices 26. The active devices may comprise a wide variety of active devices such as transistors and the like that may be used to generate the desired structural and functional parts of the design. The active devices may be formed using any suitable methods either within or else on the substrate 22.

The through vias 24 of the wafer 20 may be formed, for example, by etching openings into the substrate 22 and then depositing a conductive material into the openings. These openings for the through vias 24 may all be formed simultaneously in a same process, or in separate processes. Openings into the substrate 22 may be formed using a suitable photolithographic mask and etching process. For example, a photoresist may be formed and patterned over the substrate 22, and one or more etching processes (e.g., a wet etch process or a dry etch process) are utilized to remove those portions of the substrate 22 where the through vias 24 are desired.

Once the openings for the through vias 24 have been formed, the openings for the through vias 24 may be filled with, e.g., a liner, such as a diffusion barrier layer, an adhesion layer, or the like, and a conductive material. The liner may include titanium, titanium nitride, tantalum, tantalum nitride, or the like. The liner may be formed using a chemical vapor deposition (CVD) process, such as a plasma enhanced CVD (PECVD). However, other alternative processes, such as sputtering or metal organic chemical vapor deposition (MOCVD), may be used.

The conductive material of the through vias 24 may comprise one or more conductive materials, copper, a copper alloy, silver, gold, tungsten, aluminum, nickel, other conductive metals, or the like. The conductive material may be formed, for example, by depositing a seed layer (not shown) and using electroplating, electroless plating, or the like to deposit conductive material onto the seed layer, filling and overfilling the openings for the through vias 24. Once the openings for the through vias 24 have been filled, excess liner and excess conductive material outside of the openings for the through vias 24 may be removed through a grinding process such as chemical mechanical polishing (CMP), although any suitable removal process may be used. As one of ordinary skill in the art will recognize, the above described process for forming the through vias 24 is merely one method of forming the through vias 24, and other methods are also fully intended to be included within the scope of the embodiments. The through vias 24 may not extend through the substrate 22 at this point in processing and at a later point in processing the substrate may be thinned to expose the through vias 24 through the substrate 22 (see FIG. 11).

The passive devices 26 may be referred to as integrated passive devices (IPDs) 26. In some embodiments, the IPDs 26 may be formed by the same processes and at the same time as the through vias 24. The IPDs 26 may comprise a wide variety of passive devices such as capacitors, resistors, inductors, the like, or a combination thereof.

The IPDs 26 may be formed using any suitable methods either within or else on the first substrate 101. For example, a deep-trench capacitor may be formed by first forming trenches into the substrate 22. The trenches may be formed by any suitable photolithographic mask and etching process. For example, a photoresist may be formed and patterned over the substrate 22, and one or more etching processes (e.g., a dry etch process) may be utilized to remove those portions of the substrate 22 where the deep-trench capacitors are desired. A first capacitor electrode may be formed by forming a first conductive electrode material into a trench, such as through a deposition process or another process. The first conductive electrode material may be a conductive material such as doped silicon, polysilicon, copper, tungsten, an aluminum or copper alloy, or another conductive material. A dielectric layer may be formed over the first conductive electrode material within the trench. The dielectric layer may comprise high-K dielectric materials, an oxide, a nitride, or the like, or combinations or multiple layers thereof, and be formed using any suitable deposition process, such as a CVD process. A second conductive electrode material may be formed over the dielectric layer in the trench to form a second capacitor electrode, such as through a deposition process or another process. The second conductive electrode material may be a conductive material such as doped silicon, polysilicon, copper, tungsten, an aluminum or copper alloy, or another conductive material. As one of ordinary skill in the art will recognize, the above described process for forming deep-trench capacitors is merely one method of forming the deep-trench capacitors, and other methods are also fully intended to be included within the scope of the embodiments.

Figure 2:
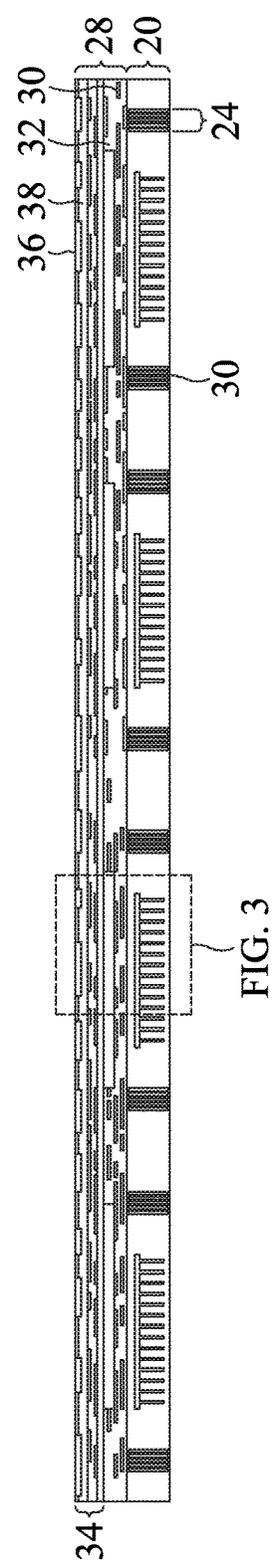
Figure 3:
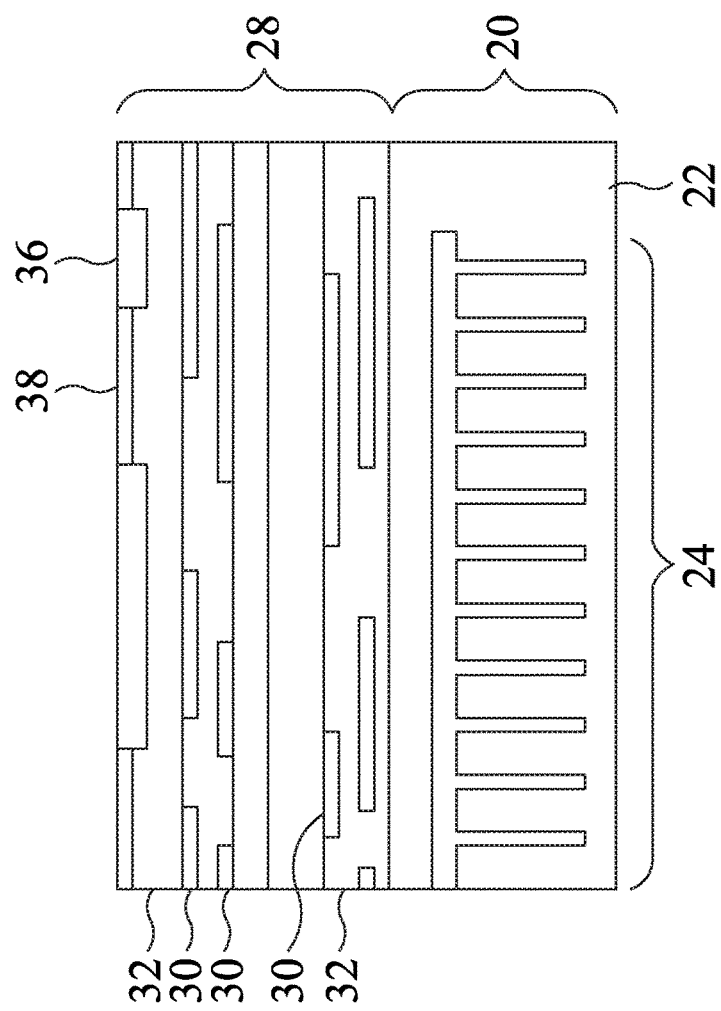

In FIGS. 2 and 3, a front-side redistribution structure 28 is formed over the wafer 20, the through vias 24, and the IPDs 26. The front-side redistribution structure 28 includes dielectric layers 32 and 38, metallization patterns 30, and bond pads 36. In some embodiments, the formation of the redistribution structure 28 begins with the formation of metallization patterns 30 over the wafer 20 followed by dielectric layers 32 and more metallization patterns 30. In other embodiments, a dielectric layer 32 is first formed over the wafer 20 followed by metallization pattern 30 and more dielectric layers 32. In some embodiments, some of the metallization patterns 30 may contact the through vias 24. In some embodiments, some of metallization patterns 30 may contact portions of the IPDs 26.

As an example to form metallization patterns 30, a seed layer (not shown) is formed over the wafer 20. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization patterns 30. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization patterns 30.

One of the dielectric layers 32 are metallization patterns 30. In some embodiments, the dielectric layers 32 and 38 are formed of a polymer, which may be a photo-sensitive material such as polybenzoxazole (PBO), polyimide, benzocyclobutene (BCB), or the like, that may be patterned using a lithography mask. In other embodiments, the dielectric layers 32 and 38 are formed of a nitride such as silicon nitride; an oxide such as silicon oxide, phosphosilicate glass (PSG), borosilicate glass (BSG), boron-doped phosphosilicate glass (BPSG); or the like. The dielectric layers 32 may be formed by spin coating, lamination, CVD, the like, or a combination thereof.

The dielectric layer 32 is then patterned. The patterning forms openings to expose portions of the underlying metallization patterns. The patterning may be by an acceptable process, such as by exposing the dielectric layer 132 to light when the dielectric layer 132 is a photo-sensitive material or by etching using, for example, an anisotropic etch. If the dielectric layer 32 is a photo-sensitive material, the dielectric layer 32 can be developed after the exposure.

The formation of metallization patterns 30 and dielectric layers 32 can then be repeated to form the redistribution structure 28 with the appropriate number of layers. After the appropriate number of layers 30 and 32 are formed, topmost metallization patterns 36, which includes bond pads 36, are formed over the layers 32 and 30 and in electrical contact with at least some of the metallization patterns 30.

As an example to form topmost metallization patterns 36, including bond pads 36, a seed layer (not shown) is formed over the topmost layer 32. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization patterns 36. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization patterns 36, including the bond pads 36. Some of the metallization patterns 36 will be used to form through vias 40 on (see FIG. 4) and are not considered to be bond pads 36.

In some embodiments, the topmost dielectric layer 38 is formed to cover the bond pads 36. In these embodiments, a planarization step, such as a grinding or CMP, is performed to remove excess portions of the topmost dielectric layer 38 and provide coplanar surfaces for the bond pads 36 and topmost dielectric layer 38.

In other embodiments, the redistribution structure 28 is formed in a dual damascene process, which includes depositing dielectric layers 32 and 38 (which may be formed as single layers or two layers separated by an etch stop layer), forming trenches in and via openings in the dielectric layers to expose some portions of the metallization patterns 30, and filling the trenches and via openings with a conductive material to form more metallization patterns 30 and/or bond pads 36. A CMP is then performed to remove excess conductive material. Accordingly, the portions of the conductive material filling the trenches in the dielectric layers 32 and 38 become the metallization patterns 30 and bond pads 36, respectively, while the portions of the conductive material filling the via openings become vias.

Figure 4:
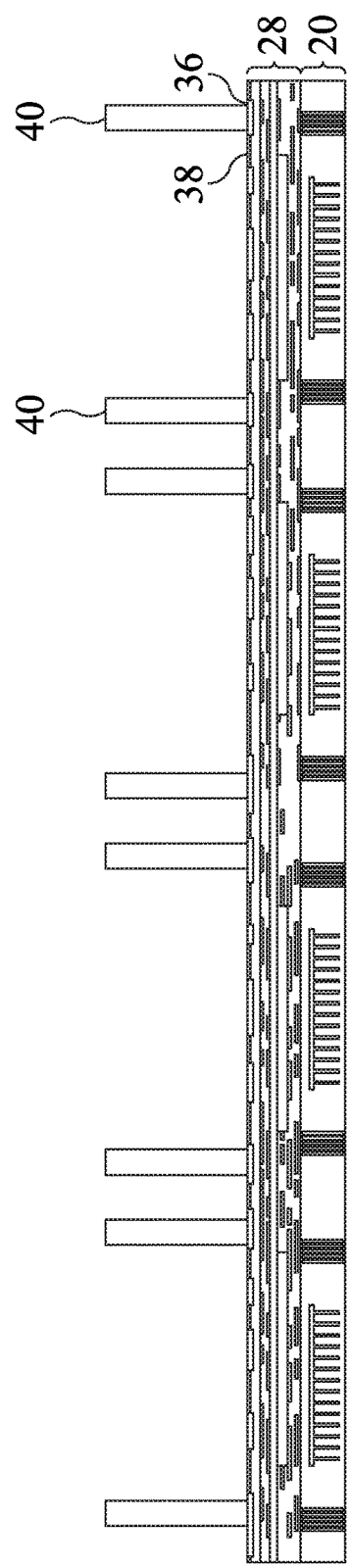

In FIG. 4, through vias 40 are formed over the redistribution structure 28. As an example to form the through vias 40, a seed layer is formed over the redistribution structure 28, e.g., the dielectric layer 38 and the exposed portions of the metallization pattern 36 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 40.

Figure 5:
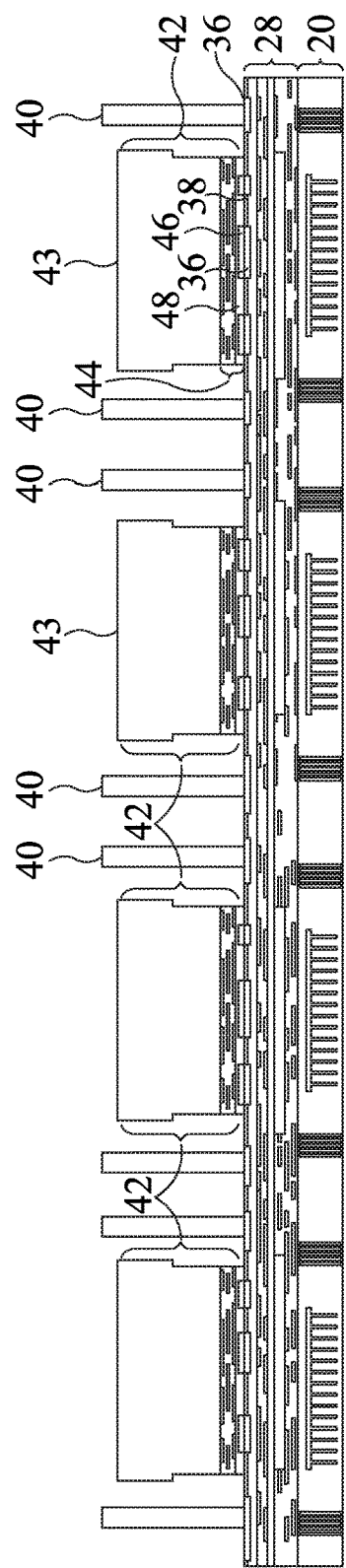

In FIG. 5, integrated circuit dies 42 are bonded to dielectric layer 38 and the bond pads 36 of the redistribution structure 28. The integrated circuit dies 42 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 42 may be different sizes (e.g., different heights and/or surface areas), and in other embodiments, the integrated circuit dies 42 may be the same size (e.g., same heights and/or surface areas).

Before being bonded to the redistribution structure 28, the integrated circuit dies 42 may be processed according to applicable manufacturing processes to form integrated circuits in the integrated circuit dies 42. For example, the integrated circuit dies 42 each include a semiconductor substrate 43, such as silicon, doped or undoped, or an active layer of a semiconductor-on-insulator (SOI) substrate. The semiconductor substrate 43 may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 43 and may be interconnected by interconnect structures 44 formed by, for example, metallization patterns in one or more dielectric layers on the semiconductor substrate 43 to form an integrated circuit.

The integrated circuit dies 42 further comprise pads (not shown), such as aluminum pads, on the interconnect structures 44 to which external connections are made. The pads are on what may be referred to as respective active sides of the integrated circuit dies 42. Die connectors 46 (may be referred to as bond pads 46), such as conductive pillars (for example, comprising a metal such as copper), are mechanically and electrically coupled to the respective pads. The die connectors 46 may be formed by, for example, plating, or the like. The die connectors 46 electrically couple the respective integrated circuits of the integrate circuit dies 42. The integrated circuit dies 42 may be singulated, such as by sawing or dicing, and placed on to the dielectric layer 108 by using, for example, a pick-and-place tool.

A dielectric material 48 is on the active sides of the integrated circuit dies 42, such as on the die connectors 46. The dielectric material 48 laterally encapsulates the die connectors 46, and the dielectric material 48 is laterally coterminous with the respective integrated circuit dies 42. The dielectric material 48 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

The integrated circuit dies 42 are bonded to the dielectric layer 38 and the bond pads 36 through hybrid bonding. To achieve the hybrid bonding, the integrated circuit dies 42 are first pre-bonded to the dielectric layer 38 and the bond pads 36 by lightly pressing the integrated circuit dies 42 against the dielectric layer 38 and the bond pads 36. Although four integrated circuit dies 42 are illustrated, the hybrid bonding may be performed at wafer level, wherein a plurality of integrated circuit dies identical to the illustrated integrated circuit dies 42 are pre-bonded, and arranged as rows and columns.

After all of the integrated circuit dies 42 are pre-bonded, an annealing is performed to cause the inter-diffusion of the metals in the bond pads 36 and the die bond pads 46. In accordance with some embodiments of the present disclosure, one or both of dielectric layers 38 and 48 comprise a polymer. Accordingly, the annealing temperature is lowered to lower than about 250° C. in order to avoid the damage of the polymer. For example, the annealing temperature (with the presence of polymer) may be in the range between about 200° and about 250° C. The annealing time may be between about 2 hours and 3 hours. When both dielectric layers 38 and 48 are formed of inorganic dielectric materials such as oxide or oxynitride, the annealing temperature may be higher, which is lower than about 400° C. For example, the annealing temperature (without the presence of polymer) may be in the range between about 300° and about 400° C., and the annealing time may be in the range between about 1.5 hours and about 2.5 hours.

Through the hybrid bonding, the bond pads 36 and 46 are bonded to each other through direct metal bonding caused by metal inter-diffusion. The bond pads 36 and 46 may have distinguishable interfaces. The dielectric layer 38 is also bonded to the dielectric layer 48, with bonds formed therebetween. For example, the atoms (such as oxygen atoms) in one of the dielectric layers 38 and 48 form chemical or covalence bonds (such as O—H bonds) with the atoms (such as hydrogen atoms) in the other one of the dielectric layers 38 and 48. The resulting bonds between the dielectric layers 38 and 48 are dielectric-to-dielectric bonds, which may be inorganic-to-polymer, polymer-to-polymer, or inorganic-to-inorganic bonds in accordance with various embodiments. Furthermore, the surface dielectric layers 48 of two integrated circuit dies 42 may be different from each other (for example, with one being a polymer layer and the other being an inorganic layer), and hence there may be two types of inorganic-to-polymer, polymer-to-polymer, and inorganic-to-inorganic bonds existing simultaneously in the same package.

Figure 6:
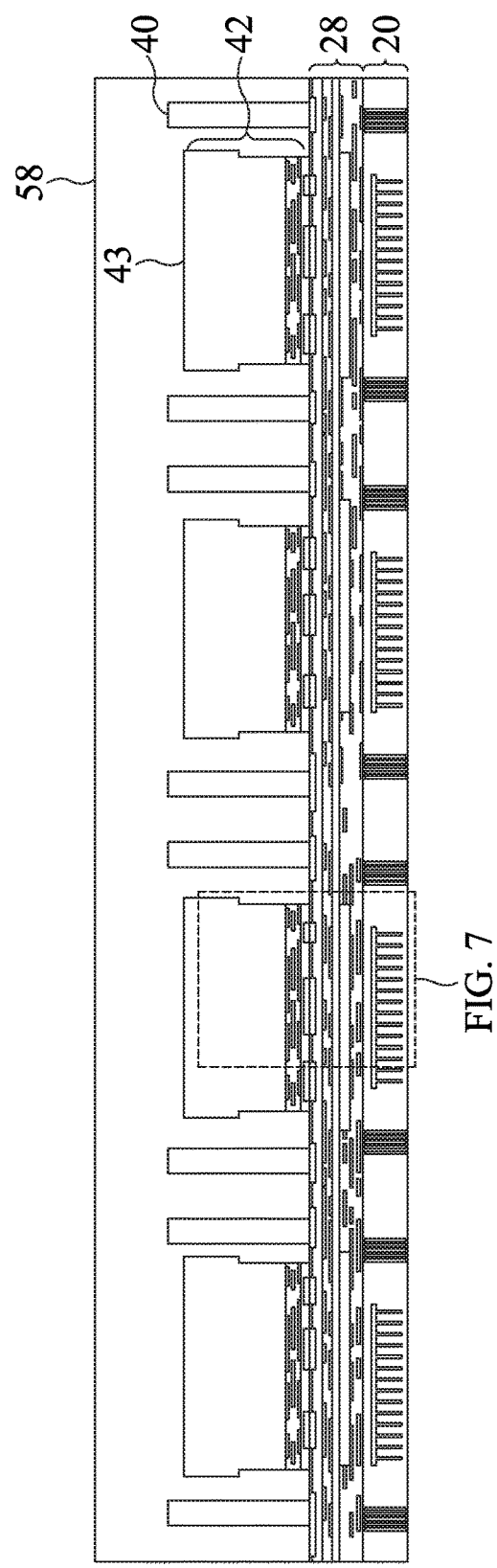
Figure 7:
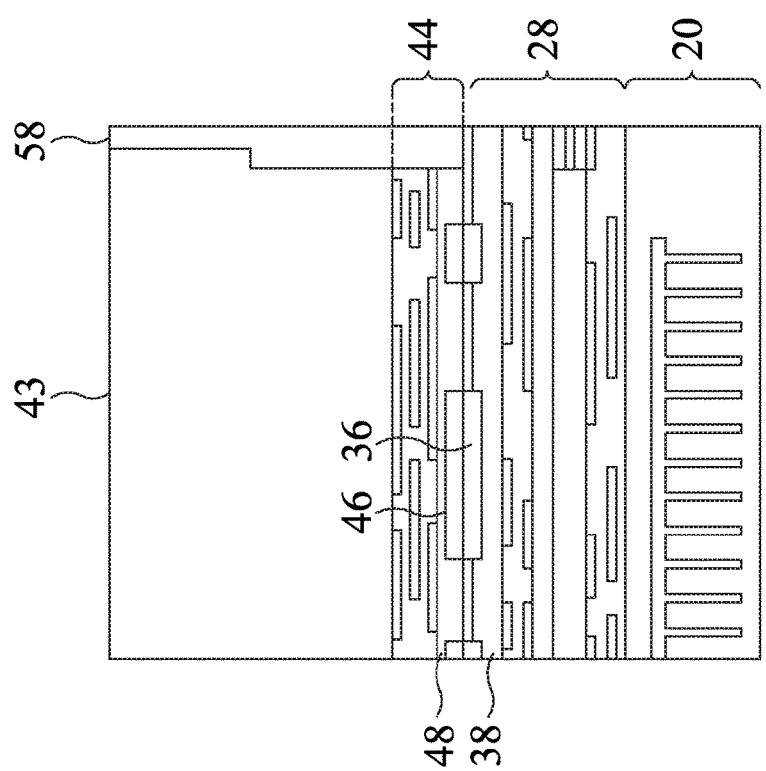

In FIGS. 6 and 7, an encapsulant 58 is formed on the various components. The encapsulant 58 may be a molding compound, epoxy, or the like, and may be applied by compression molding, transfer molding, or the like. The top surface of encapsulant 58 is higher than the top ends of through vias 40 and the backside surface of the integrated circuit dies 42. The encapsulant 58 is then cured. In accordance with other embodiments, encapsulant 58 can be formed of an inorganic dielectric material including an oxide (such as silicon oxide or silicon oxynitride) or a nitride (such as silicon nitride). The formation methods of the encapsulant 58 in accordance with these embodiments may include CVD.

Figure 8:

In FIG. 8, a planarization such as a CMP step or a grinding step is performed to thin the encapsulant 58 until through vias 40 (if any) are exposed. Top surfaces of the through vias 40 and the encapsulant 58 are coplanar after the planarization process. In some embodiments, the planarization process may be omitted, for example, if through vias 40 are already exposed through the encapsulant 58. Although not shown, in some embodiments, the planarization process may expose backside surfaces of the integrated circuit dies 42.

Figure 9:
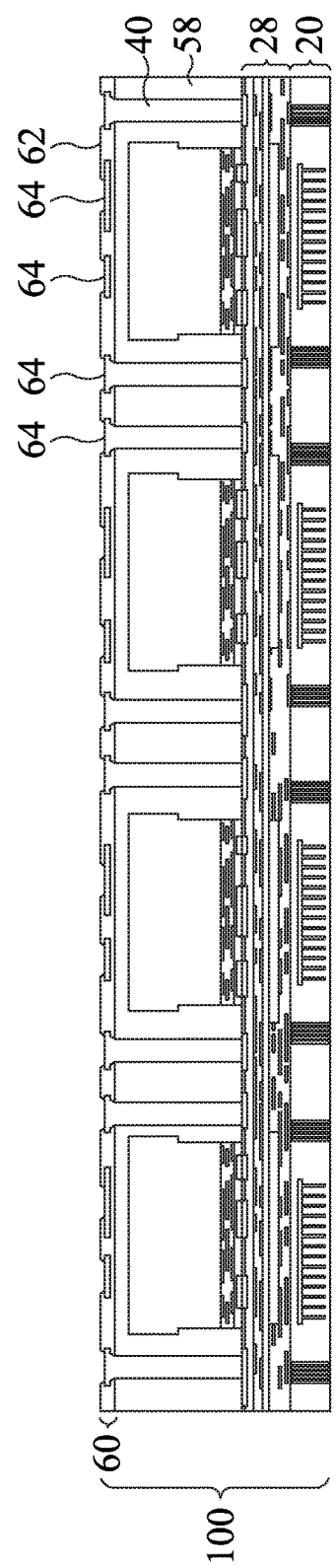

In FIG. 9, a backside redistribution structure 60 is formed. As will be illustrated in FIG. 9, the backside redistribution structure 60 includes one or more dielectric layers 62 and metallization patterns 64. A first dielectric layer 62 is deposited on the encapsulant 58 and the through vias 40. In some embodiments, the dielectric layer 62 is formed of a polymer, which may be a photo-sensitive material such as PBO, polyimide, BCB, or the like, that may be patterned using a lithography mask. In other embodiments, the dielectric layer 62 is formed of a nitride such as silicon nitride; an oxide such as silicon oxide, PSG, BSG, BPSG; or the like. The dielectric layer 62 may be formed by spin coating, lamination, CVD, the like, or a combination thereof.

Next, the first dielectric layer 62 is then patterned. The patterning forms openings to expose portions of the through vias 40. The patterning may be by an acceptable process, such as by exposing the dielectric layer 62 to light when the dielectric layer 62 is a photo-sensitive material or by etching using, for example, an anisotropic etch. If the dielectric layer 62 is a photo-sensitive material, the dielectric layer 62 can be developed after the exposure.

Next, metallization pattern 64 with vias is formed on the first dielectric layer 62. As an example to form metallization pattern 64, a seed layer (not shown) is formed over the first dielectric layer 62 and in openings through the first dielectric layer 62. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 64. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 64 and vias. The vias are formed in openings through the first dielectric layer 62 to, e.g., the through vias 40.

Next, a second dielectric layer 62 is deposited on the metallization pattern 64 and the first dielectric layer 62. In some embodiments, the second dielectric layer 62 is formed of a polymer, which may be a photo-sensitive material such as PBO, polyimide, BCB, or the like, that may be patterned using a lithography mask. In other embodiments, the second dielectric layer 62 is formed of a nitride such as silicon nitride; an oxide such as silicon oxide, PSG, BSG, BPSG; or the like. The second dielectric layer 62 may be formed by spin coating, lamination, CVD, the like, or a combination thereof.

The second dielectric layer 62 is then patterned. The patterning forms openings to expose portions of the metallization pattern 64. The patterning may be by an acceptable process, such as by exposing the dielectric layer 140 to light when the dielectric layer is a photo-sensitive material or by etching using, for example, an anisotropic etch. If the second dielectric layer 62 is a photo-sensitive material, the second dielectric layer 62 can be developed after the exposure.

The back-side redistribution structure 60 is shown as an example. More or fewer dielectric layers and metallization patterns may be formed in the back-side redistribution structure 60. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

The structure illustrated in FIG. 9 may be referred to as one or more first packages 100, which, in some embodiments, may be singulated at a later time in processing.

Figure 10:
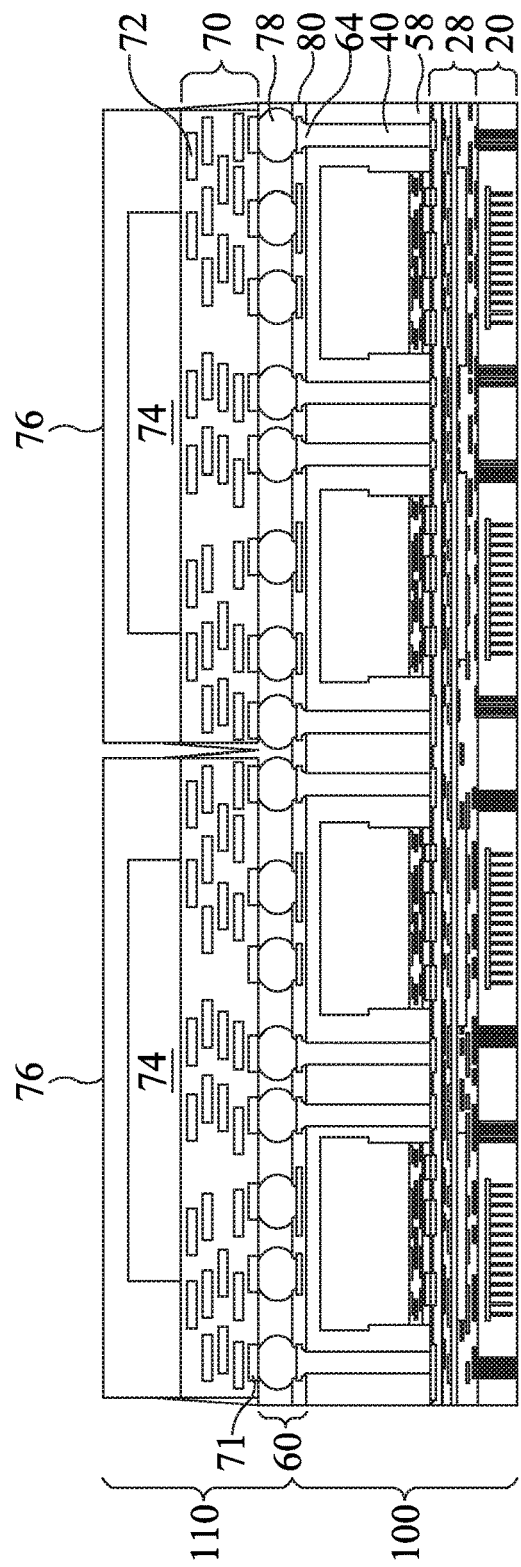

In FIG. 10, one or more second packages 110 are bonded to the one or more first packages 100 of FIG. 9. Each of the second packages 110 includes a substrate 70 and one or more dies 74 coupled to the substrate 70. The substrate 70 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 70 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 70 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 70.

The substrate 70 may include active and passive devices (not shown). As one of ordinary skill in the art will recognize, a wide variety of devices such as transistors, capacitors, resistors, combinations of these, and the like may be used to generate the structural and functional requirements of the design for the package. The devices may be formed using any suitable methods.

The substrate 70 may also include metallization layers 72 and through vias (not shown). The metallization layers 72 may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 70 is substantially free of active and passive devices.

The substrate 70 may have bond pads (not shown) on a first side the substrate 70 to couple to the dies 74, and bond pads 71 on a second side of the substrate 70, the second side being opposite the first side of the substrate 70, to couple to the conductive connectors 78. In some embodiments, the bond pads are formed by forming recesses (not shown) into dielectric layers (not shown) on the first and second sides of the substrate 70. The recesses may be formed to allow the bond pads to be embedded into the dielectric layers. In other embodiments, the recesses are omitted as the bond pads may be formed on the dielectric layer. In some embodiments, the bond pads include a thin seed layer (not shown) made of copper, titanium, nickel, gold, palladium, the like, or a combination thereof. The conductive material of the bond pads may be deposited over the thin seed layer. The conductive material may be formed by an electro-chemical plating process, an electroless plating process, CVD, ALD, PVD, the like, or a combination thereof. In an embodiment, the conductive material of the bond pads 303 and 304 is copper, tungsten, aluminum, silver, gold, the like, or a combination thereof.

In an embodiment, the bond pads are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs. Any suitable materials or layers of material that may be used for the UBMs are fully intended to be included within the scope of the current application. In some embodiments, the through vias extend through the substrate 70 and couple at least one bond pad one the first side of the substrate 70 to at least one bond pad 71 on the second side of the substrate.

The dies 74 may be coupled to the substrate 70 by wire bonds or conductive bumps. In an embodiment, the dies 74 are stacked memory dies. For example, the stacked memory dies 74 may include low-power (LP) double data rate (DDR) memory modules, such as LPDDR1, LPDDR2, LPDDR3, LPDDR4, or the like memory modules.

In some embodiments, the dies 308 and the wire bonds (if present) may be encapsulated by a molding material 76. The molding material 76 may be molded on the dies 74, for example, using compression molding. In some embodiments, the molding material 76 is a molding compound, a polymer, an epoxy, silicon oxide filler material, the like, or a combination thereof. A curing step may be performed to cure the molding material 76, wherein the curing may be a thermal curing, a UV curing, the like, or a combination thereof.

In some embodiments, the dies 74 and the wire bonds (if present) are buried in the molding material 76, and after the curing of the molding material 76, a planarization step, such as a grinding, is performed to remove excess portions of the molding material 76 and provide a substantially planar surface for the second packages 110.

After the second packages 110 are formed, the second packages 110 are bonded to the first packages 100 by way of conductive connectors 78, the bond pads 71, and the metallization pattern 64.

The conductive connectors 78 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 78 may include a conductive material such as solder, copper, aluminum, gold, nickel, silver, palladium, tin, the like, or a combination thereof. In some embodiments, the conductive connectors 78 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 78 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 78. The metal cap layer may include nickel, tin, tin-lead, gold, silver, palladium, indium, nickel-palladium-gold, nickel-gold, the like, or a combination thereof and may be formed by a plating process.

In some embodiments, before bonding the conductive connectors 78, the conductive connectors 78 are coated with a flux (not shown), such as a no-clean flux. The conductive connectors 78 may be dipped in the flux or the flux may be jetted onto the conductive connectors 78. In another embodiment, the flux may be applied to the surfaces of the metallization patterns 64.

In some embodiments, the conductive connectors 78 may have an epoxy flux (not shown) formed thereon before they are reflowed with at least some of the epoxy portion of the epoxy flux remaining after the second package 110 is attached to the first package 100. This remaining epoxy portion may act as an underfill to reduce stress and protect the joints resulting from the reflowing the conductive connectors 78. In some embodiments, an underfill 80 may be formed between the second package 110 and the first package 100 and surrounding the conductive connectors 78. The underfill may be formed by a capillary flow process after the second package 110 is attached or may be formed by a suitable deposition method before the second package 110 is attached.

The bonding between the second package 110 and the first package 100 may be a solder bonding or a direct metal-to-metal (such as a copper-to-copper or tin-to-tin) bonding. In an embodiment, the second package 110 is bonded to the first package 200 by a reflow process. During this reflow process, the conductive connectors 78 are in contact with the bond pads 71 and the metallization patterns 64 to physically and electrically couple the second package 110 to the first package 100. After the bonding process, an IMC (not shown) may form at the interface of the metallization patterns 64 and the conductive connectors 78 and also at the interface between the conductive connectors 78 and the bond pads 71.

Figure 11:
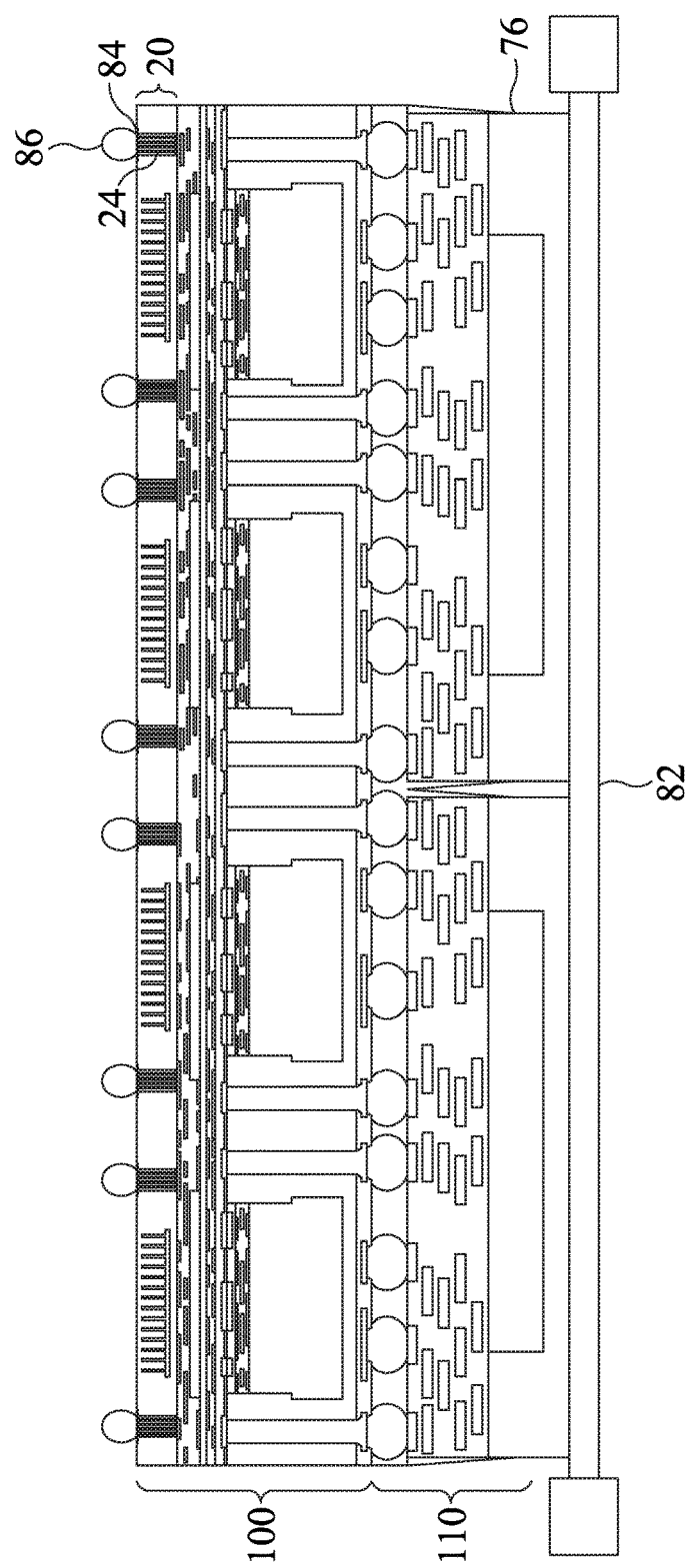

In FIG. 11, the structure including one or more first packages 100 and one or more second packages 110 is flipped over and placed on a tape 82. Further, the wafer 20 can undergo a grinding process to expose the through vias 24. Surfaces of the through vias 24 and wafer 20 are coplanar after the grinding process. In some embodiments, the grinding may be omitted, for example, if through vias 24 are already exposed through the wafer 20.

After the through vias 24 are exposed, pads 84 and conductive connectors 86 are formed over the through vias 24. The pads 84 are formed on exposed surfaces of the through vias 24. The pads 84 are used to couple to conductive connectors 86 and may be referred to as under bump metallurgies (UBMs) 84. As an example to form the pads 84, a seed layer (not shown) is formed over the surface of the wafer 20. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 84. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 84. In the embodiment, where the pads 84 are formed differently, more photo resist and patterning steps may be utilized.

The conductive connectors 86 are formed on the UBMs 84. The conductive connectors 86 may be BGA connectors, solder balls, metal pillars, C4 bumps, micro bumps, ENEPIG formed bumps, or the like. The conductive connectors 86 may include a conductive material such as solder, copper, aluminum, gold, nickel, silver, palladium, tin, the like, or a combination thereof. In some embodiments, the conductive connectors 86 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 86 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 86. The metal cap layer may include nickel, tin, tin-lead, gold, silver, palladium, indium, nickel-palladium-gold, nickel-gold, the like, or a combination thereof and may be formed by a plating process.

Figure 12:
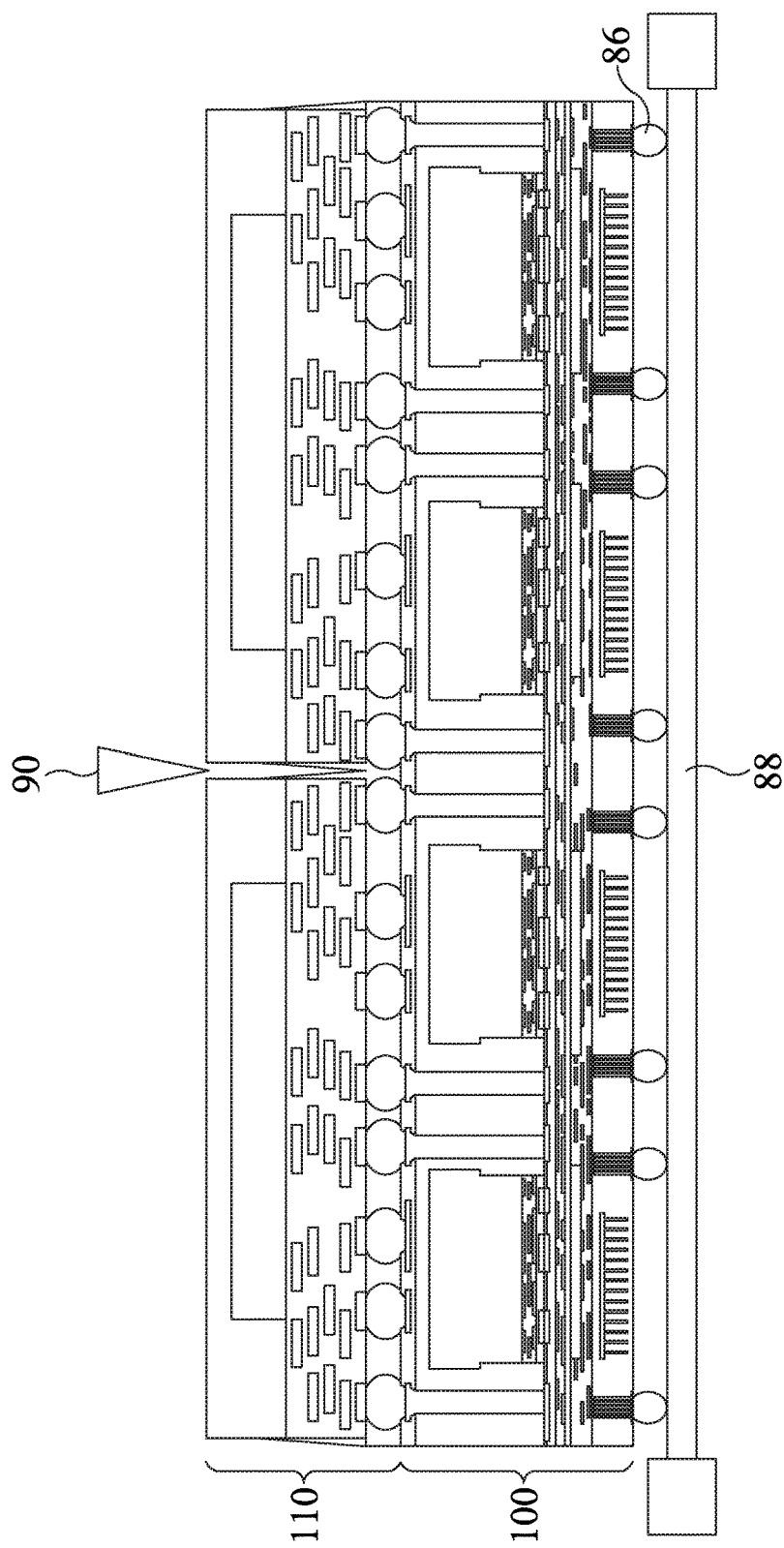

In FIG. 12, the structure including one or more first packages 100 and one or more second packages 110 is flipped over and placed on a tape 88. Further, a singulation process is performed by sawing 90 along scribe line regions e.g., between second packages 110 and first packages 100.

Figure 13:
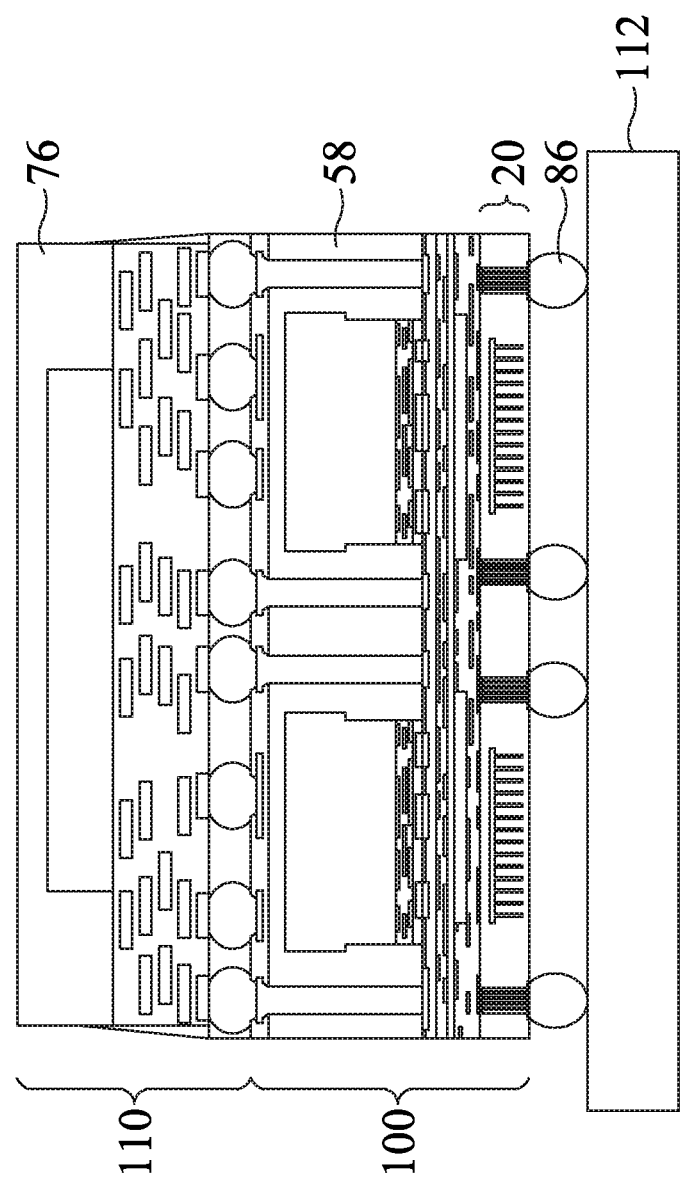

FIG. 13 illustrates a resulting, singulated package, which includes a first package 100 and a second package 110. Further, package including the packages 100 and 110 may be mounted to a substrate 112. The substrate 112 may be referred to a package substrate 112. The package 100 is mounted to the package substrate 400 using the conductive connectors 86.

The package substrate 112 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 112 may be a SOI substrate. Generally, an SOI substrate includes a layer of a semiconductor material such as epitaxial silicon, germanium, silicon germanium, SOI, SGOI, or combinations thereof. The package substrate 112 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 112.

The package substrate 1112 may include active and passive devices (not shown). As one of ordinary skill in the art will recognize, a wide variety of devices such as transistors, capacitors, resistors, combinations of these, and the like may be used to generate the structural and functional requirements of the design for the semiconductor package. The devices may be formed using any suitable methods.

The package substrate 112 may also include metallization layers and vias and bond pads (not shown) over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 112 is substantially free of active and passive devices.

In some embodiments, the conductive connectors 86 can be reflowed to attach the packages 100 and 110 to the substrate 112. The conductive connectors 86 electrically and/or physically couple the substrate 112, including metallization layers in the substrate 112, to the first package 100.

The conductive connectors 86 may have an epoxy flux (not shown) formed thereon before they are reflowed with at least some of the epoxy portion of the epoxy flux remaining after the packages 110 and 100 are attached to the substrate 112. This remaining epoxy portion may act as an underfill to reduce stress and protect the joints resulting from the reflowing the conductive connectors 86. In some embodiments, an underfill (not shown) may be formed between the first package 100 and the substrate 112 and surrounding the conductive connectors 86. The underfill may be formed by a capillary flow process after the packages 110 and 100 are attached or may be formed by a suitable deposition method before the packages 110 and 100 are attached.

Figure 14:
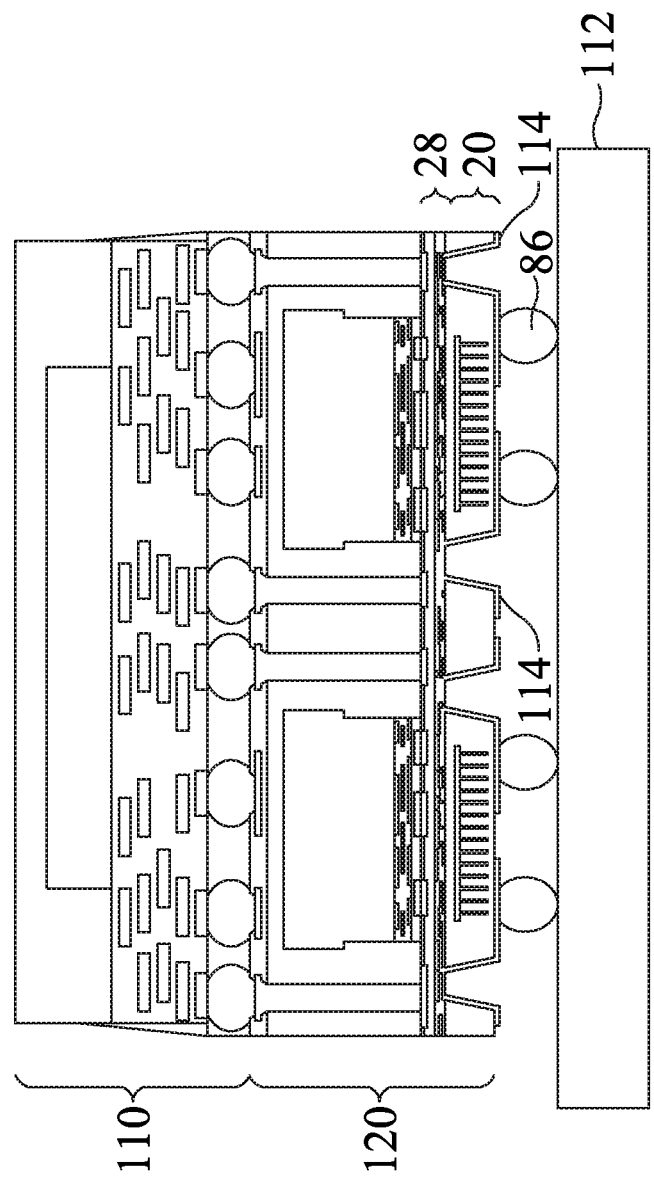
FIG. 14 illustrates a cross-sectional view of a package structure including openings through a wafer in accordance with some embodiments.

FIG. 14 illustrates a cross-sectional view of a package structure including openings through a wafer in accordance with some embodiments. This embodiment is similar to the previous embodiment of FIGS. 1 through 13 except that in this embodiment, the wafer 20 has openings formed through it with electrical connectors 114 formed in the openings instead of the through vias 24. Details regarding this embodiment that are similar to those for the previously described embodiment will not be repeated herein.

In FIG. 14, the wafer 20 may have openings formed through it to allow for the conductive connectors 86 to be electrically coupled to the front-side redistribution structure 28. The openings may be formed through the wafer 20 by, for example, using laser drilling, etching, or the like. The openings may be formed just before the conductive connectors 86 are formed (see, e.g., FIG. 11 of previous embodiment) or may be formed earlier in the process.

The electrical connectors 114 may be formed in the openings through the wafer 20 while the structure is flipped over on a tape similar to that shown in FIG. 11. As an example to form electrical connectors 114, a seed layer (not shown) is formed over the wafer 20 and in the openings. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the electrical connectors 114. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the electrical connectors 114.

After the electrical connectors 114 are formed, the conductive connectors 86 may be formed on the electrical connectors 114. In some embodiments, there are UBMs between the conductive connectors 86 and the electrical connectors 114.

Figure 15:
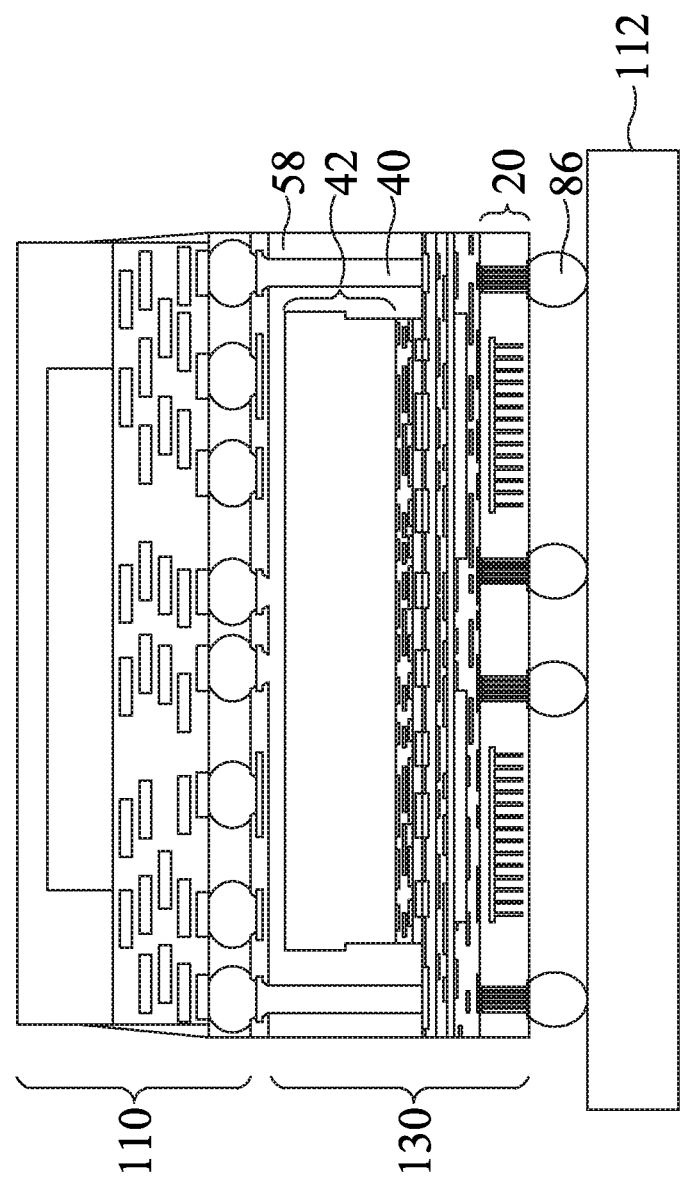
FIG. 15 illustrates a cross-sectional view of a package structure including a single integrated circuit die in accordance with some embodiments.

FIG. 15 illustrates a cross-sectional view of a package structure including a single integrated circuit die 42 in accordance with some embodiments. This embodiment is similar to the previous embodiment of FIGS. 1 through 13 except that in this embodiment, the package structure includes a single integrated circuit die 42 instead of multiple integrated circuit dies 42. Details regarding this embodiment that are similar to those for the previously described embodiment will not be repeated herein.

FIGS. 16 through 23 illustrate cross-sectional views of intermediate steps during a process for forming a package structure in accordance with some embodiments. This embodiment is similar to the previous embodiment of FIG. 15 except that in this embodiment, the first package 110 has been replaced with an integrated fan-out (InFO) package structure 160. Details regarding this embodiment that are similar to those for the previously described embodiment will not be repeated herein.

Figure 16:
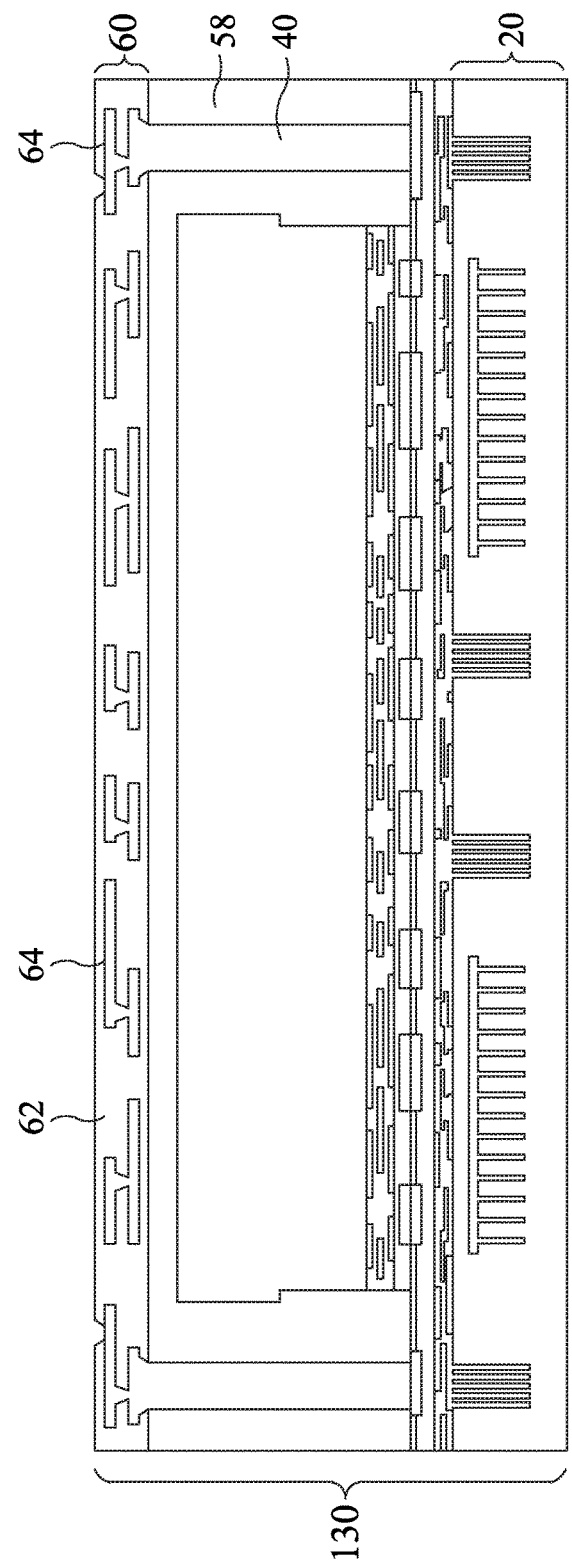
FIGS. 16 through 23 illustrate cross-sectional views of intermediate steps during a process for forming a package structure in accordance with some embodiments.

FIGS. 16 through 23 illustrate cross-sectional views of intermediate steps of forming the first package 160 over the second package 130 of FIG. 15. In these Figures only one first package 160 is illustrated but multiple first packages 160 may be formed simultaneously over multiple second packages 160 and then the structure may be singulated to form multiple package structures. FIG. 16 illustrates openings in the redistribution structure 60 to expose portions of the metallization pattern 64.

Figure 17:
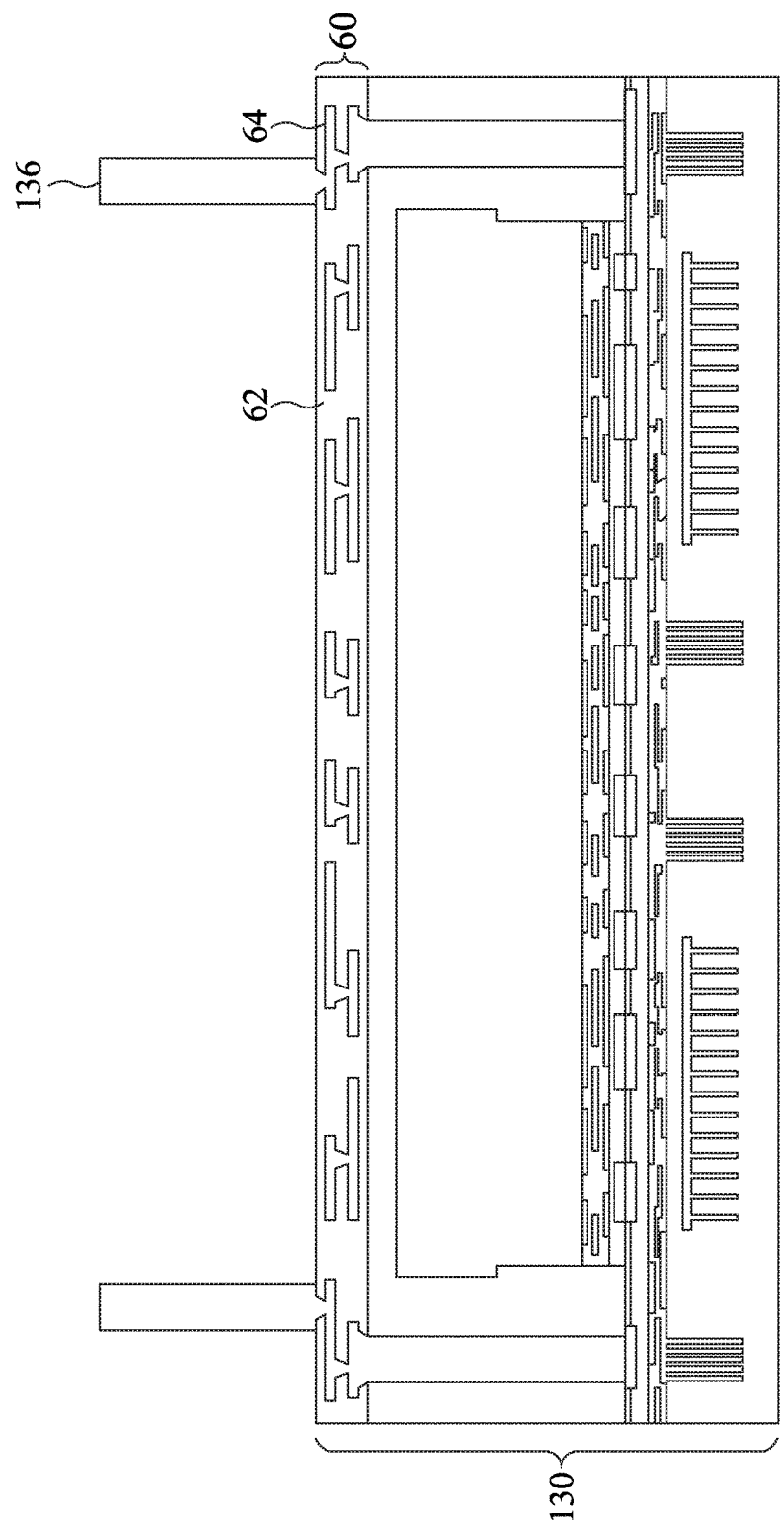

In FIG. 17, through vias 136 are formed. As an example to form the through vias 136, a seed layer is formed over the redistribution structure 60 an in the openings. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 136.

Figure 18:
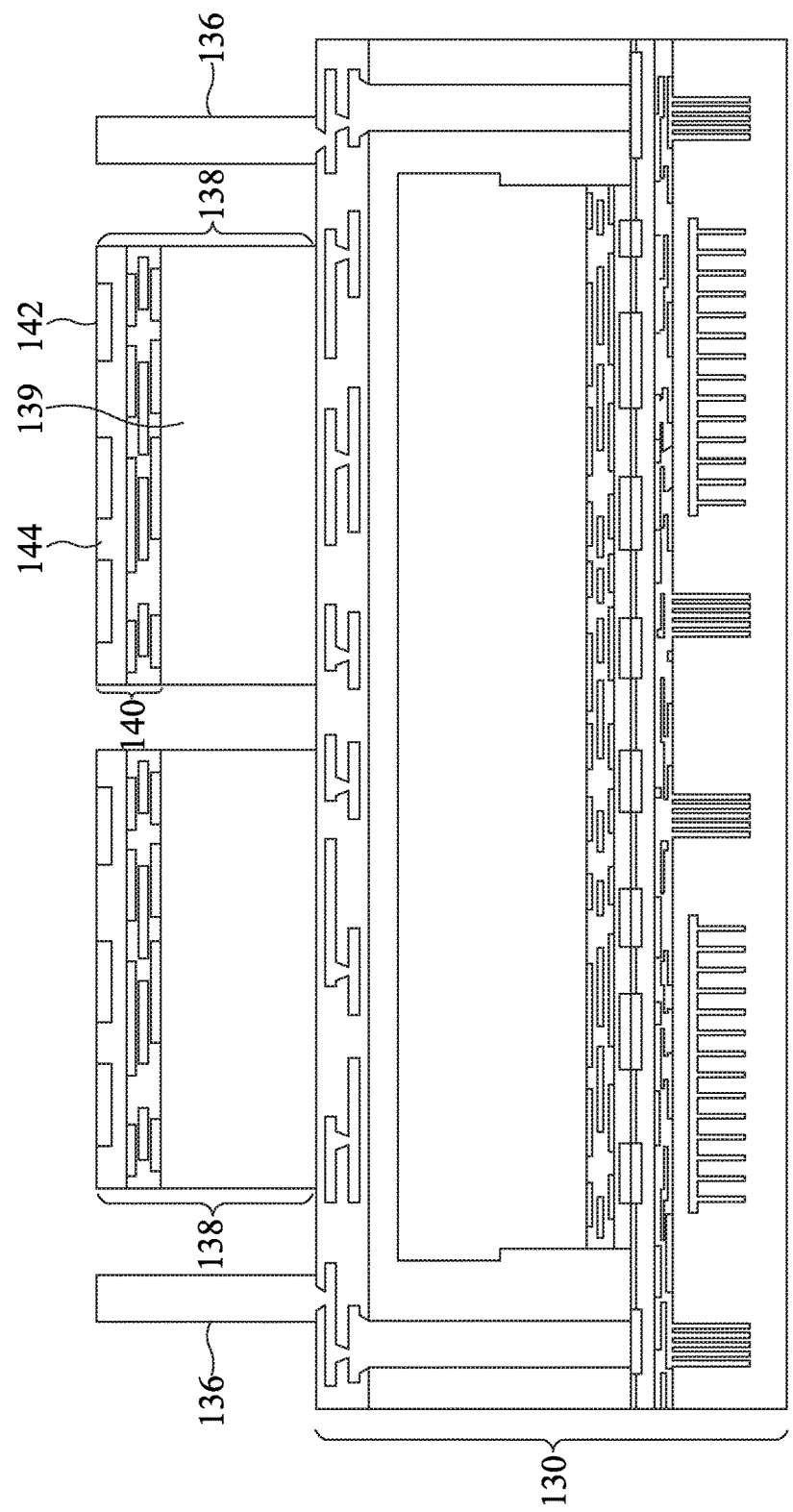

In FIG. 18, integrated circuit dies 138 are attached to the redistribution structure 60 by an adhesive (not shown). As illustrated in FIG. 18, two integrated circuit dies 138 are attached, and in other embodiments, more or less integrated circuit dies 138 may be attached for each package structure. The integrated circuit dies 138 may be logic dies (e.g., central processing unit, microcontroller, etc.), memory dies (e.g., DRAM die, SRAM die, etc.), power management dies (e.g., PMIC die), RF dies, sensor dies, MEMS dies, signal processing dies (e.g., DSP die), front-end dies (e.g., AFE dies), the like, or a combination thereof. Also, in some embodiments, the integrated circuit dies 138 may be different sizes (e.g., different heights and/or surface areas), and in other embodiments, the integrated circuit dies 138 may be the same size (e.g., same heights and/or surface areas).

Before being adhered, the integrated circuit dies 138 may be processed according to applicable manufacturing processes to form integrated circuits in the integrated circuit dies 138. For example, the integrated circuit dies 138 each include a semiconductor substrate 139, such as silicon, doped or undoped, or an active layer of a semiconductor-on-insulator (SOI) substrate. The semiconductor substrate 139 may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 139 and may be interconnected by interconnect structures 120 formed by, for example, metallization patterns in one or more dielectric layers on the semiconductor substrate 139 to form an integrated circuit.

The integrated circuit dies 138 further comprise pads, such as aluminum pads, to which external connections are made. The pads are on what may be referred to as respective active sides of the integrated circuit dies 138. Die connectors 142, such as conductive pillars (for example, comprising a metal such as copper), are mechanically and electrically coupled to the respective pads. The die connectors 142 may be formed by, for example, plating, or the like. The die connectors 142 electrically couple the respective integrated circuits of the integrate circuit dies 138.

A dielectric material 144 is on the active sides of the integrated circuit dies 138, such as on the die connectors 142. The dielectric material 144 laterally encapsulates the die connectors 142, and the dielectric material 144 is laterally coterminous with the respective integrated circuit dies 138. The dielectric material 144 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

The adhesive layer (not shown) may be on back sides of the integrated circuit dies 138 and adheres the integrated circuit dies 138 to the first package 130. The adhesive may be any suitable adhesive, epoxy, die attach film (DAF), or the like. The adhesive may be applied to a back side of the integrated circuit dies 138, such as to a back-side of the respective semiconductor wafer or may be applied over the surface of the first package 130. The integrated circuit dies 138 may be singulated, such as by sawing or dicing, and adhered to the first package 130 by the adhesive using, for example, a pick-and-place tool.

Figure 19:
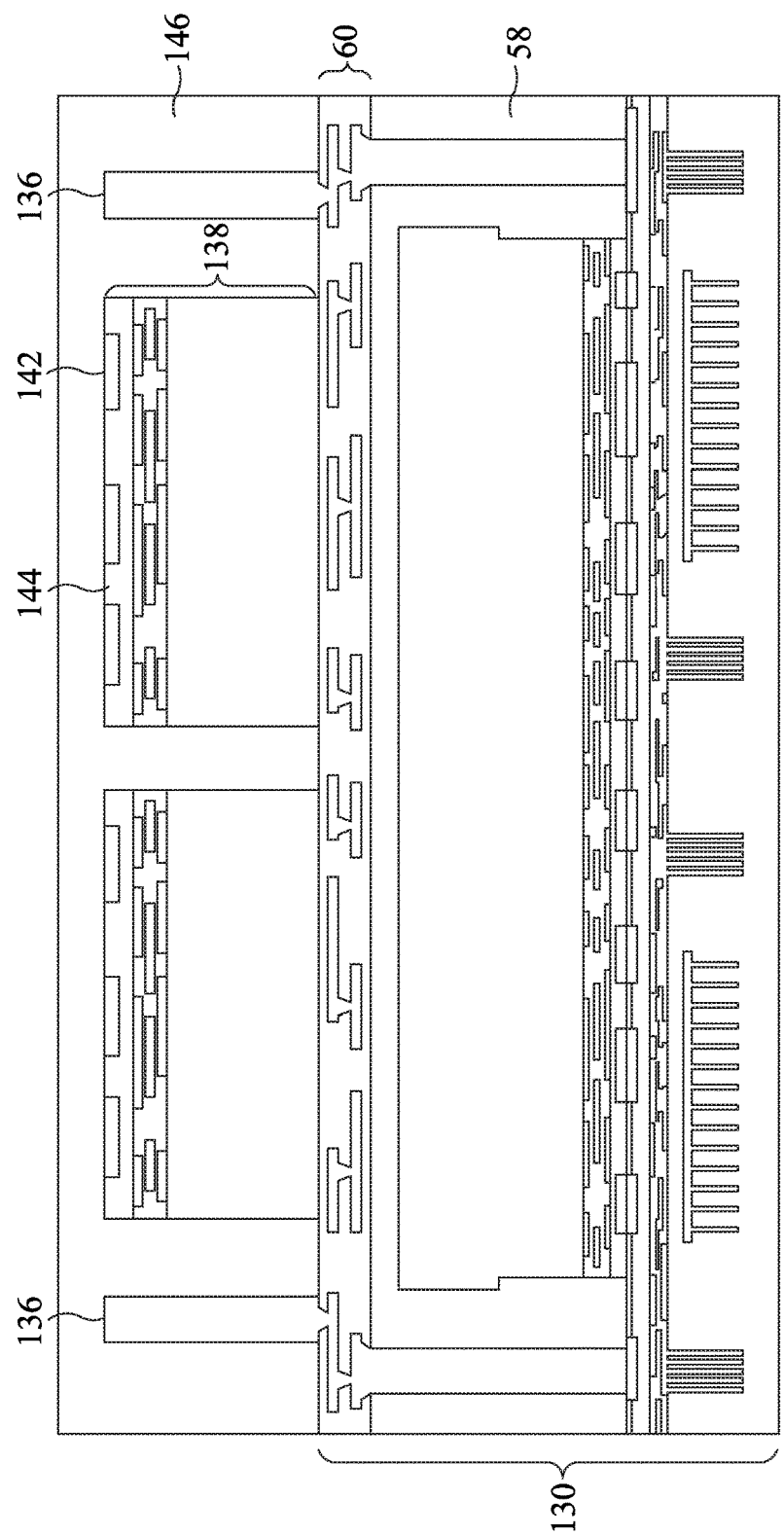

In FIG. 19, an encapsulant 146 is formed on the various components. The encapsulant 146 may be a molding compound, epoxy, or the like, and may be applied by compression molding, transfer molding, or the like.

Figure 20:
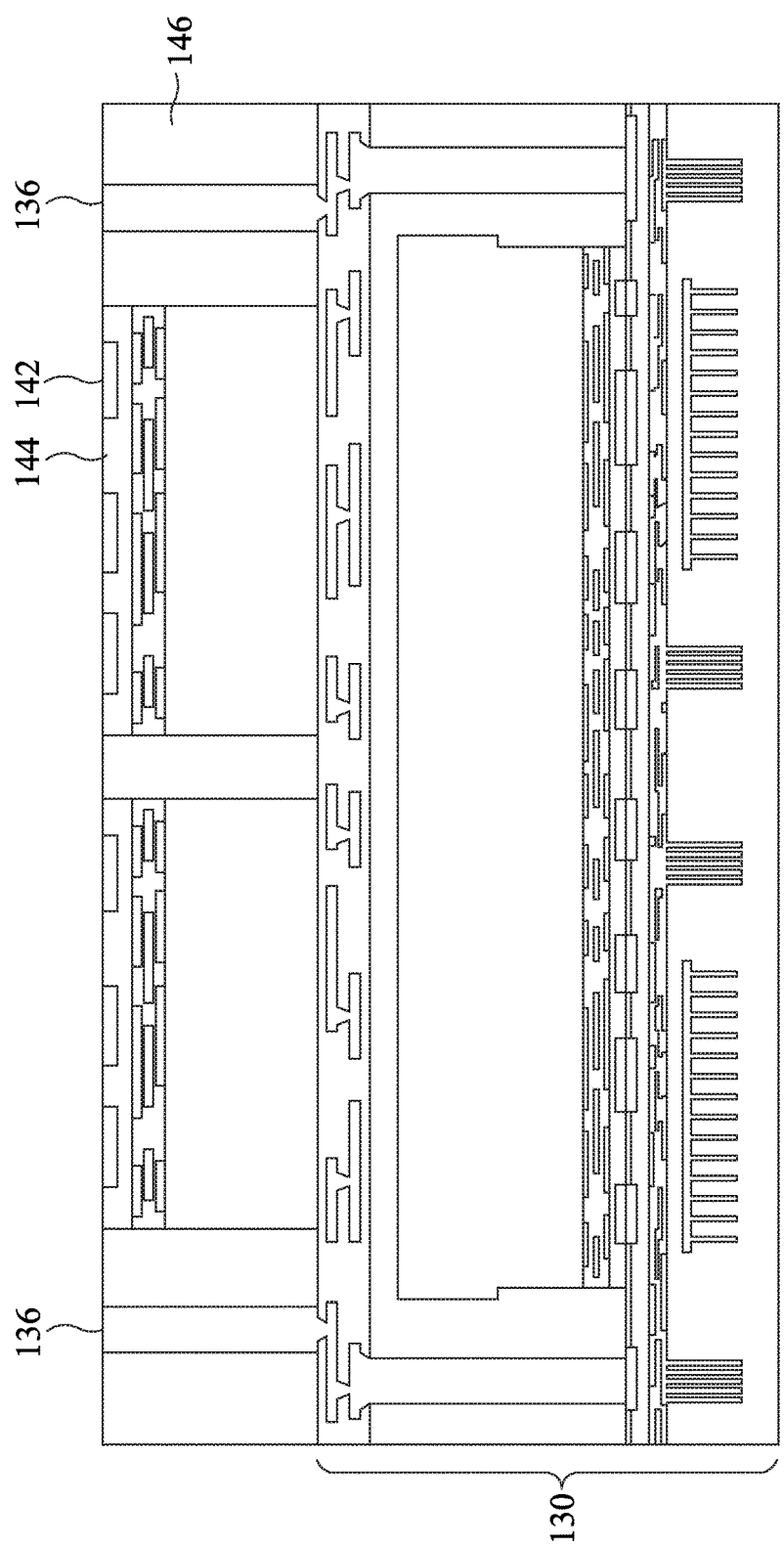

In FIG. 20, after curing, the encapsulant 146 can undergo a grinding process to expose the through vias 136 and die connectors 142. Top surfaces of the through vias 136, die connectors 142, and encapsulant 146 are coplanar after the grinding process. In some embodiments, the grinding may be omitted, for example, if through vias 136 and die connectors 142 are already exposed.

Figure 21:
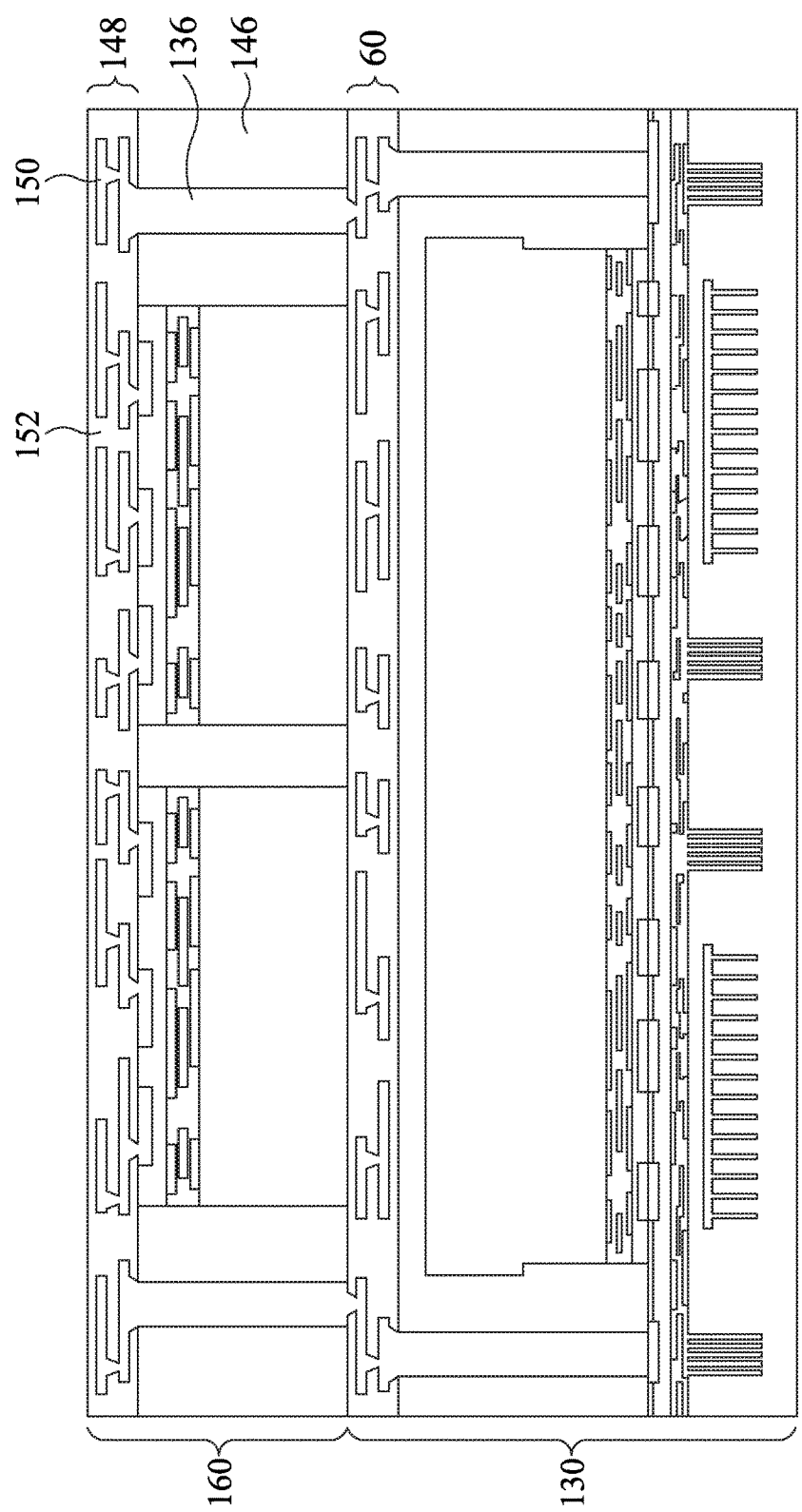

In FIG. 21, a front-side redistribution structure 148 is formed. As illustrated in FIG. 21, the front-side redistribution structure 148 includes dielectric layers 152, and metallization patterns 150 that are coupled to the through vias 136 and the die connectors 142. The redistribution structure 148 may be formed similar to the redistribution structure 60 described above and the description is not repeated herein. After the formation of the redistribution structure 148, the second package 160 is formed.

The front-side redistribution structure 148 is shown as an example. More or fewer dielectric layers and metallization patterns may be formed in the front-side redistribution structure 148. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Figure 22:
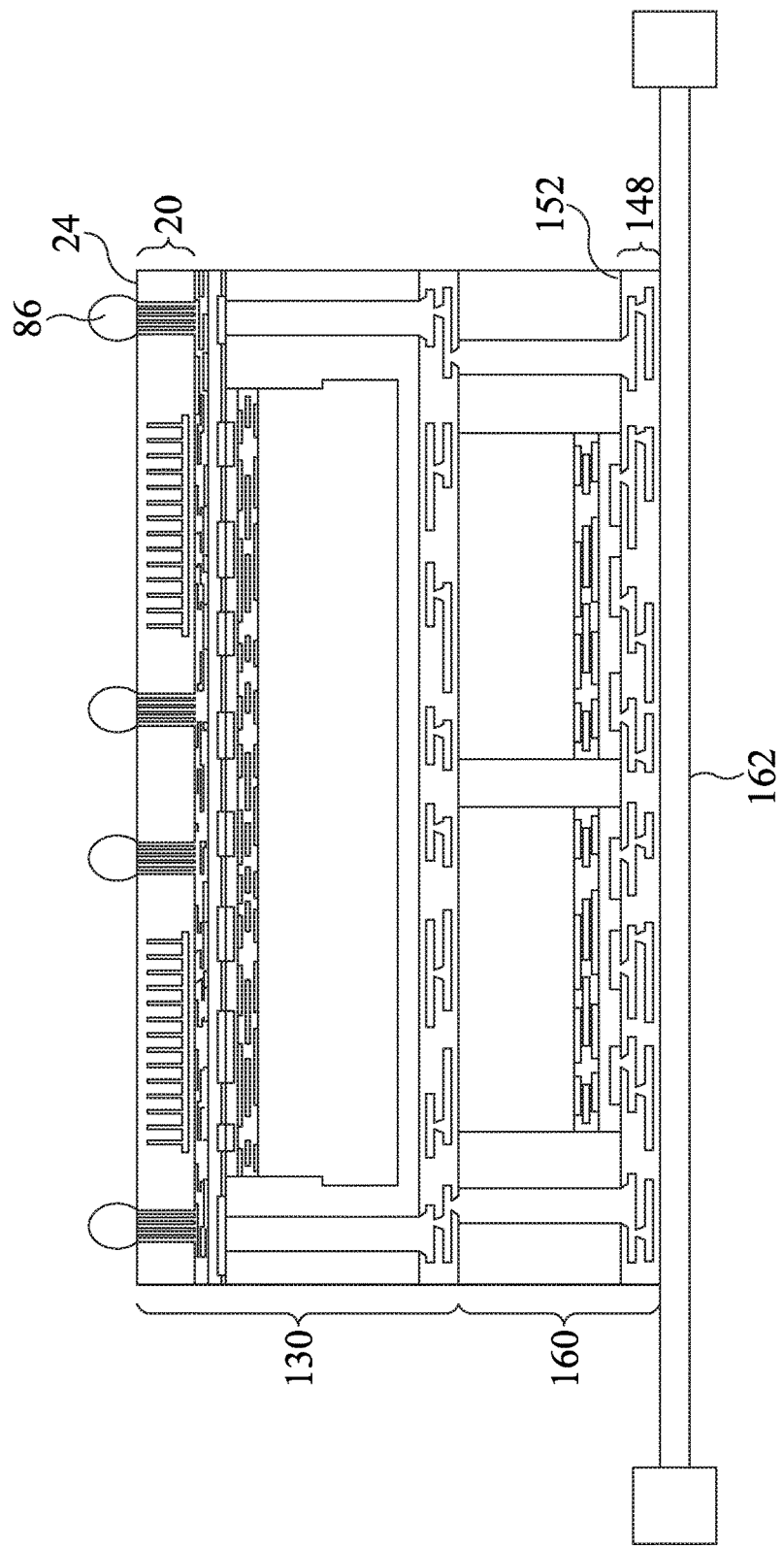

In FIG. 22, the structure including one or more first packages 130 and one or more second packages 160 is flipped over and placed on a tape 162. Further, the wafer 20 can undergo a grinding process to expose the through vias 24. Surfaces of the through vias 24 and wafer 20 are coplanar after the grinding process. In some embodiments, the grinding may be omitted, for example, if through vias 24 are already exposed through the wafer 20. After the through vias 24 are exposed, pads (not shown) and conductive connectors 86 are formed over the through vias 24.

In some embodiments, the structure including one or more first packages 130 and one or more second packages 160 is flipped over and placed on a tape for a singulation process.

Figure 23:
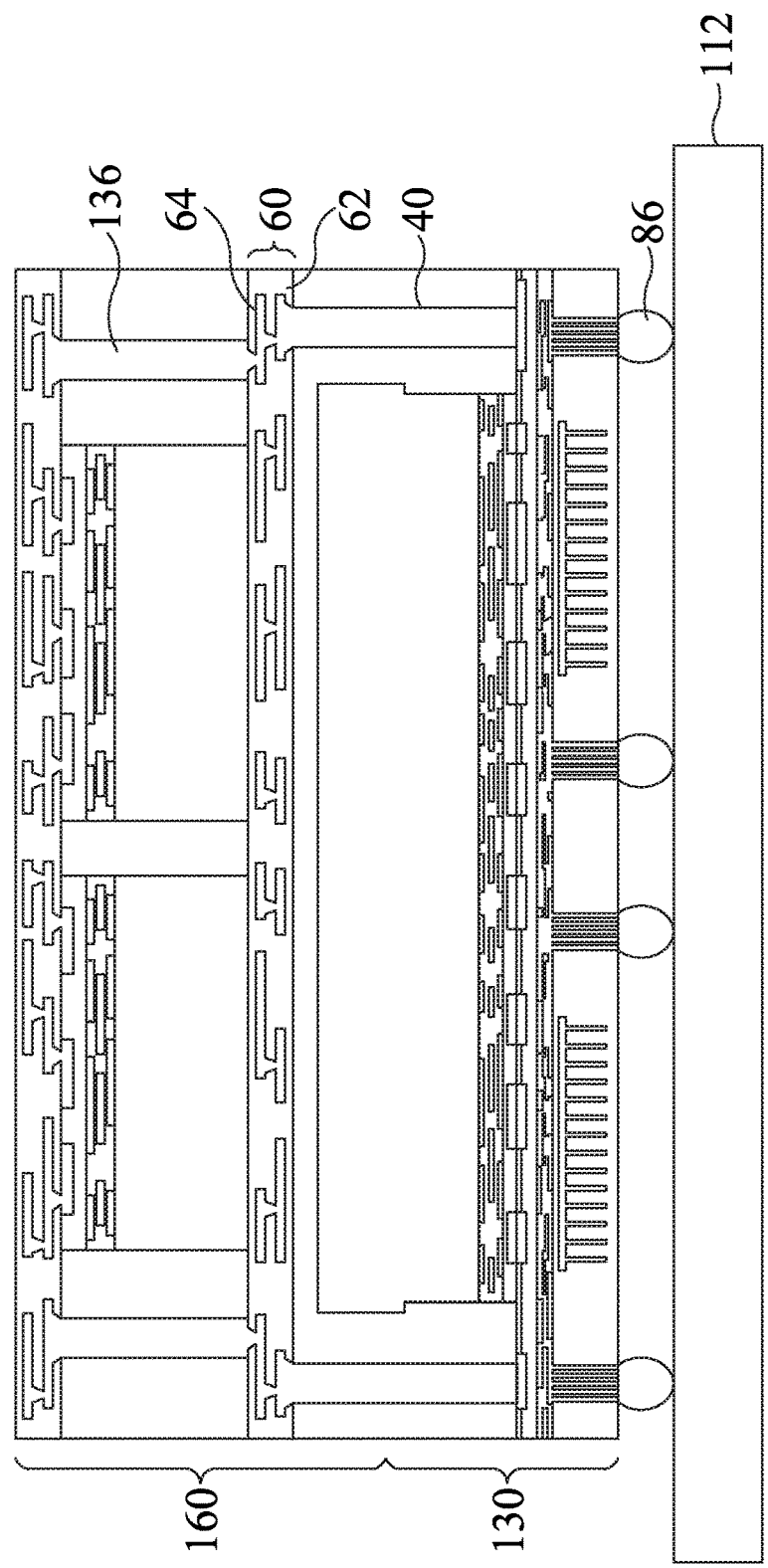

FIG. 23 illustrates a resulting, singulated package, which includes a first package 130 and a second package 160. Further, the package including the packages 130 and 160 may be mounted to a substrate 112. The substrate 112 may be referred to a package substrate 112. The package 100 is mounted to the package substrate 400 using the conductive connectors 86.

Embodiments discussed herein may achieve advantages. In particular, the disclosed embodiments include an integrated fan-out design that enables more functionality and reliability. The package structures may include a chip/die that is hybrid bonded to a wafer structure with the wafer structure including one or more integrated passive devices (IPDs). Some of disclosed methods of forming the package structure include optimization of the method that does not require as many carrier substrates (or, in some cases, no carrier substrates) as other methods. Further, the hybrid bonding process allows for the bond between the chip/die and the wafer to not include a solder material, and thus, may increase the reliability and yield of package structures.

An embodiment is a method including forming a first passive device in a first wafer, forming a first dielectric layer over a first side of the first wafer, forming a first plurality of bond pads in the first dielectric layer, planarizing the first dielectric layer and the first plurality of bond pads to level top surfaces of the first dielectric layer and the first plurality of bond pads with each other, hybrid bonding a first device die to the first dielectric layer and at least some of the first plurality of bond pads, and encapsulating the first device die in a first encapsulant.

Another embodiment is a method including forming a first package including forming a passive device and a through via in a first wafer, forming a first redistribution structure over a first side of the first wafer, the first redistribution structure including a first plurality of bond pads in a first dielectric layer, top surfaces of the first plurality of bond pads substantially coplanar with a top surface of the first dielectric layer, forming a first electrical connector on one of the first plurality of bond pads, bonding a first device die to the first redistribution structure, a dielectric layer of the first device die being bonded to the first dielectric layer, and metal pads in the first device die being bonded to the first plurality of bond pads through metal-to-metal bonding, and encapsulating the first device die in a first molding compound.

A further embodiment is a structure including a first wafer including a first passive device and a first through via, the first passive device being embedded in the first wafer, the first through via extending through the first wafer, a first redistribution structure on a first side of the first wafer, the first redistribution structure including a plurality of metallization patterns comprising a first plurality of bond pads, and a first plurality of dielectric layers, with the plurality of metallization patterns located in the first plurality of dielectric layers, and the first plurality of dielectric layers comprises a first dielectric layer, with a first surface of the first dielectric layer being substantially coplanar with first surfaces of the first plurality of bond pads, and a device die including a second plurality of bond pads bonded to the first plurality of bond pads through metal-to-metal bonding, and a second plurality of dielectric layers including a second dielectric layer, with the second dielectric layer having a second surface substantially coplanar with second surfaces of the second plurality bond pads, wherein the first dielectric layer is bonded to the second dielectric layer through dielectric-to-dielectric bonds.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a first substrate comprising a first passive device;
   a first dielectric layer over a first side of the first substrate;
   a first bond pad and a second bond pad in the first dielectric layer, a first surface of the first dielectric layer being level with first surfaces of the first and second bond pads;
   a first die comprising an active side and a backside, the active side comprising:
      a second dielectric layer, the second dielectric layer being bonded to the first dielectric layer through dielectric-to-dielectric bonds, wherein the first dielectric layer extends laterally beyond outermost lateral sidewalls of the second dielectric layer; and a third bond pad in the second dielectric layer, a second surface of the second dielectric layer being level with the third bond pad, the third bond pad being bonded to the first bond pad through metal-to-metal bonds;

a first electrical connector on the second bond pad;

a first encapsulant over the first dielectric layer and on sidewalls of the first die and the first electrical connector, the first electrical connector extending through the first encapsulant.

2. The structure of claim 1 further comprising:
a first redistribution structure on the first side of the first substrate, the first redistribution structure comprising a plurality of metallization layers in a plurality of dielectric layers, the first dielectric layer being one of the plurality of dielectric layers, the first and second bond pads being in one of the plurality of metallization layers.

3. The structure of claim 2 further comprising:
a second redistribution structure over the first encapsulant, the first encapsulant being interposed between a backside of the first die and the second redistribution structure, the first electrical connector being electrically coupled to the second redistribution structure.

4. The structure of claim 3 further comprising:
a second die over the second redistribution structure;
a second electrical connector adjacent the second die, the second electrical connector being electrically coupled to the second redistribution structure;
a second encapsulant on the second redistribution structure, the second encapsulant encapsulating the second electrical connector and the second die; and
a third redistribution structure over the second encapsulant, the third redistribution structure being electrically coupled to the second electrical connector.

5. The structure of claim 4, wherein an active side of the second die is distal the second redistribution structure and a backside of the second die is proximate the second redistribution structure.

6. The structure of claim 1 further comprising:
a package structure over and bonded to the first electrical connector with a first bonding joint, the package structure comprising a second die.

7. The structure of claim 1, wherein the first passive device comprises a capacitor, a resistor, an inductor, or a combination thereof.

8. The structure of claim 1, wherein the second dielectric layer and the third bond pad are parts of a first interconnect structure of the first die.

9. The structure of claim 1, wherein the first dielectric layer is bonded to the second dielectric layer with respective bonds comprising O—H bonds.

10. The structure of claim 1 further comprising:
a first through via in the first substrate, the first through via being electrically coupled to the first bond pad or the second bond pad.

11. A package structure comprising:
a first substrate comprising a first passive device, the first substrate having a first surface and a second surface opposite the first surface;
a first through via extending from the first surface of the first substrate to the second surface of the first substrate;
a conductive connector disposed at the first surface of the first substrate, the conductive connector being electrically connected to the first through via;
a first redistribution structure over the second surface of the first substrate and the first passive device, the first redistribution structure comprising a first dielectric layer, a first metallization pattern, a first bond pad, and a second bond pad, the first and second bond pads being in the first dielectric layer, the first metallization pattern being electrically connected to the first through via and the first passive device;
a first die bonded to the first redistribution structure, the first die having an active side and a backside, the active side comprising a third bond pad and a second dielectric layer, the third bond pad being bonded to the first bond pad through metal-to-metal bonds, the second dielectric layer being bonded to the first dielectric layer through dielectric-to-dielectric bonds;
a first electrical connector adjacent the first die and electrically coupled to the second bond pad;
a first encapsulant on the first redistribution structure, the first encapsulant encapsulating the first electrical connector and the first die; and
a second redistribution structure over the first encapsulant, the second redistribution structure comprising a fourth bond pad, the fourth bond pad being electrically coupled to the first electrical connector.

12. The package structure of claim 11 further comprising:
a second die over the second redistribution structure;
a second electrical connector adjacent the second die, the second electrical connector being electrically coupled to the second redistribution structure;
a second encapsulant on the second redistribution structure, the second encapsulant encapsulating the second electrical connector and the second die; and
a third redistribution structure over the second encapsulant, the third redistribution structure being electrically coupled to the second electrical connector.

13. The package structure of claim 12, wherein an active side of the second die is distal the second redistribution structure and a backside of the second die is proximate the second redistribution structure.

14. The package structure of claim 11, wherein the first dielectric layer extends laterally beyond the outermost lateral sidewalls of the second dielectric layer.

15. A method comprising:
forming a first passive device in a first wafer;
forming a first redistribution structure over a first side of the first wafer, the first redistribution structure comprising a first plurality of bond pads in a first dielectric layer;
planarizing the first dielectric layer and the first plurality of bond pads to level top surfaces of the first dielectric layer and the first plurality of bond pads with each other;
hybrid bonding a first device die to the first dielectric layer and at least some of the first plurality of bond pads;
encapsulating the first device die in a first encapsulant;
laser drilling from a second side of the first wafer to form an opening through the first wafer, the opening through the first wafer exposing a conductive feature in the first redistribution structure;
forming a first electrical connector in the opening and along the second side of the first wafer, the first electrical connector being electrically coupled to the first redistribution structure;
forming a conductive connector on the first electrical connector; and
singulating the first encapsulant and the first wafer.

16. The method of claim 15, wherein the laser drilling from the second side is performed after encapsulating the first device die.

17. The method of claim 15 further comprising:
forming a second electrical connector adjacent the first device die, the second electrical connector being electrically coupled to the first redistribution structure, the second electrical connector extending through the first encapsulant; and
bonding a package structure over the first device die and the second electrical connector, the package structure comprising a second device die.

18. The method of claim 15 further comprising:
before the encapsulating, plating a second electrical connector on the one of the first plurality of bond pads; and
planarizing a surface of the first encapsulant to expose a surface of the second electrical connector.

19. The method of claim 15 further comprising:
forming a second redistribution structure over the first device die and the first encapsulant;
adhering a second device die over the second redistribution structure; and
forming a third redistribution structure over the second device die, the third redistribution structure being electrically coupled to the second device die.

20. The method of claim 19, wherein an active side of the second device die faces away from the active side of the first device die.

* * * * *